United States Patent

[11] 3,622,904

[72] Inventor Peter Michael Knight
Maidstone, England
[21] Appl. No. 873,458
[22] Filed Nov. 3, 1969
[45] Patented Nov. 23, 1971
[73] Assignee Elliott Brothers (London) Limited
London, England
[32] Priority Nov. 4, 1968
[33] Great Britain
[31] 52,196/68

[54] SWITCHING CIRCUITS
1 Claim, 1 Drawing Fig.

[52] U.S. Cl. .......... 330/103, 330/51
[51] Int. Cl. .......... H03f 1/36
[50] Field of Search .......... 330/51, 103

[56] References Cited
UNITED STATES PATENTS

| | | | |
|---|---|---|---|
| 3,346,697 | 10/1967 | Kitsopoulos | 179/15 |
| 3,516,002 | 6/1970 | Hillis | 330/51 |

*Primary Examiner*—Nathan Kaufman
*Attorney*—Kirschstein, Kirschstein, Ottinger & Frank

ABSTRACT: A switching circuit has an output resistance and a dummy output resistance, two switches respectively associated with the output resistances and an amplifier and dual feedback resistances respectively associated with the switches. The feedback resistances, switches and output resistances are such that a substantially unvarying current flows in the output of the amplifier either to the output or dummy output resistance depending on the switching states of the switches. As a result, the amplifier does not introduce any lag into the operation of the switching circuit.

PATENTED NOV 23 1971 3,622,904
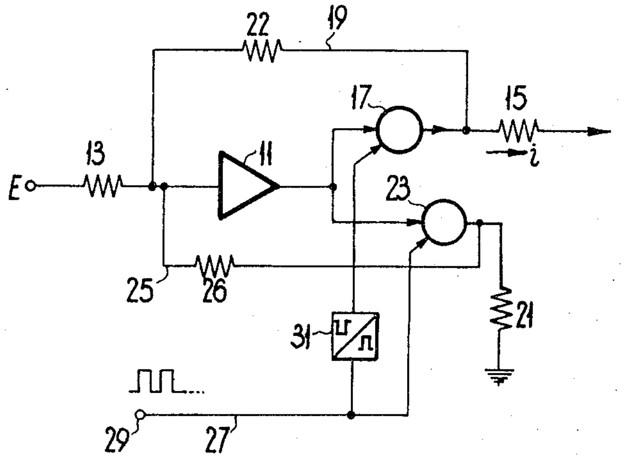
INVENTOR
PETER M. KNIGHT
BY Kirschstein, Kirschstein, Ottinger & Frank
ATTORNEYS

SWITCHING CIRCUITS

This invention relates to electric switching circuits.

According to the invention an electric switching circuit comprises: a signal amplifier device; an input impedance for the amplifier; an output resistance; a switch connected between the amplifier output and the output resistance; a resistive feedback path extending from the junction between the switch and the output resistance to the junction between the input impedance and the amplifier device; a dummy output resistance; another switch connected between the output of the amplifier device and the dummy output resistance; a resistive dummy feedback path extending from the junction between the other switch and the dummy output resistance to the junction between the amplifier device and the input impedance; and circuitry for controlling the switches so that when one switch is closed the other is open.

The output resistance and the dummy output resistance may be of substantially the same value, and in this event both resistances are connected to zero potential with respect to earth.

An embodiment of the invention is hereinafter described with reference to the accompanying drawing the single FIGURE of which shows a schematic circuit diagram of a switching circuit.

The required characteristics of the device shown in the drawing are that, in response to a switching pulse, the current *i* flowing in the output resistance of the circuit, is proportional to an input voltage E or is zero accordingly as the pulse is at one voltage level or another.

The circuit comprises: an amplifier device 11, an input resistance 13, an output resistance 15, a switch 17 connected between the output of the device 11 and the output resistance 15, and a feedback path 19 which has a resistance 22, connected from the junction between the switch 17 and the output resistance 15 to the junction between the device 11 and the input resistance 13. The output resistance 15 is connected to a point, e.g. the virtual earth of an operational amplifier (not shown), which is at zero potential with respect to earth.

A dummy output resistance 21 is connected to earth. Another switch 23 is connected between the output of the device 11 and the dummy output resistance 21. A dummy feedback path 25 which has a feedback resistance 26, extends from the junction between the switch 23 and the dummy output resistance 21 to the junction between the input to the device 11 and the input resistance 13.

The switches 17 and 23, which may, for example, comprise field effect transistors, are controlled by circuitry 27 so that when one switch is closed the other is open. The latter circuitry has an input 29 to which pulses of, for example, a pulse width modulated waveform, are applied. The switches 17 and 23 are both adapted to close when a pulse is at one voltage level and to open when a pulse is at another voltage level. So that one switch is closed when the other is open, the input to one 17 of the switches includes a signal inverter 31.

In operation pulses are applied to the switch inputs and a voltage E is applied to the input resistance 13. With the switch 17 closed a certain current *i* flows in the output resistance 15. When the switch 17 opens at the fall of the pulse, the switch 23 closes and current is then switched from the output resistance 15 to the dummy output resistance 21.

The current in the dummy resistance 21 differs from the current previously flowing in the output resistance 15 as a result of differences between the offset voltages and on-impedances of the switches 17 and 23 and as a result of differences in the values of the feedback resistances 22 and 26. By closely matching the switches as to offset voltage and on-impedance and by correspondingly matching the values of the feedback resistances 22 and 26, the signal applied to the amplifier device 11 is sensible constant at all times. In practice, due to small discrepancies between the characteristics of the switches and small differences in the feedback resistance values, there is a change in the value of the output voltage of the amplifier 11 when current is switched from the output resistance 15 to the dummy output resistance 21. This change may be very small compared with the change which would occur in the absence of the dummy output resistance 21, the switch 23 and the dummy feedback path 25, and consequently the effect on the speed of operation of the circuit, as a result of lags in the amplifier device 11, may also be made very small.

The voltage E applied to the input resistance 13 need not be constant but such variations in the voltage E as may occur should be of a frequency not greater than that which the amplifier device 11 is able to follow.

A steady-state analysis of the circuit of the drawing follows. In the analysis $R_1$ is the value of the input resistance 13, $R_2$ and $R_2'$ are the values of the feedback resistances 22 and 26, respectively, $R_3$ and $R_3'$ are the values of the output resistance 15 and the dummy output resistance 21, respectively, E is the voltage applied to the input resistance 13, $v_A$ is the output voltage from the amplifier device 11, $v_F$ is the voltage appearing at the junction between the switch 17 and the output resistance 15, and $v_F'$ is the voltage at the junction between the switch 23 and the dummy output resistance 21.

When the switch drive input is high, switch 17 is closed and switch 23 is open. The voltage $v_F$ is then given by $$v_F = -\frac{R_2}{R_1}E$$

Hence output current $$i\frac{v_F}{R_3} = -\frac{R_2}{R_1R_3}E$$

When the switch drive input is low, switch 23 is closed and switch 17 is open. The voltage $v_F$ is then given by $$v_F = 0$$

Hence i = 0

However, $$v_F{}^1 = \frac{R_2{}^1}{R_1}E$$

Also $v_A \approx v_F'$.

Now since, when the switch drive input is high, $$v_A \approx v_F = -\frac{R_2}{R_1}E$$

and, when the switch drive input is low, $$v_A \approx v_F{}^1 = -\frac{R_2{}^1}{R_1}E$$

then, for $R_2' \approx R_2$, $v_A$ is required to change by only a small amount when the switch drive input changes state. Thus errors due to the amplifier lag will be small.

I claim:

1. A switching circuit which comprises: a signal amplifier device; an input impedance for the amplifier; a first output resistance connected to an output line; a first switch connected between the amplifier output and the output resistance and operable to connect the amplifier output to the output line via the first output resistance; a resistive feedback path extending from the junction between the first switch and the first output resistance to the junction between the input impedance and the amplifier device; a dummy output resistance; a second switch connected between the output of the amplifier device and the dummy output resistance and operable to connect such dummy output resistance across the amplifier output; a resistive dummy feedback path extending from the junction between said second switch and the dummy output resistance to the junction between the amplifier device and the input impedance; and circuitry for controlling the switches so that when one switch is closed the other is open.

* * * * *